US010163855B2

(12) United States Patent
Paek et al.

(10) Patent No.: US 10,163,855 B2
(45) Date of Patent: Dec. 25, 2018

(54) SEMICONDUCTOR DEVICE AND MANUFACTURING METHOD THEREOF

(71) Applicant: Amkor Technology, Inc., Tempe, AZ (US)

(72) Inventors: Jong Sik Paek, Incheon (KR); Doo Hyun Park, Anyang-si (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/812,953

(22) Filed: Nov. 14, 2017

(65) Prior Publication Data

US 2018/0076172 A1 Mar. 15, 2018

Related U.S. Application Data

(63) Continuation of application No. 15/070,368, filed on Mar. 15, 2016, now Pat. No. 9,818,721.

(30) Foreign Application Priority Data

Mar. 16, 2015 (KR) .................. 10-2015-0035939

(51) Int. Cl.
  *H01L 25/065* (2006.01)
  *H01L 21/56* (2006.01)
  (Continued)

(52) U.S. Cl.
  CPC ........ *H01L 25/0652* (2013.01); *H01L 21/568* (2013.01); *H01L 23/5389* (2013.01); *H01L 24/19* (2013.01); *H01L 24/20* (2013.01); *H01L 24/96* (2013.01); *H01L 25/50* (2013.01); *H01L 2224/12105* (2013.01); *H01L 2224/13025* (2013.01); *H01L 2224/16146* (2013.01); *H01L 2224/16227* (2013.01); *H01L 2224/17181* (2013.01); *H01L 2224/32145* (2013.01); *H01L 2224/32225* (2013.01);
  (Continued)

(58) Field of Classification Search
  CPC ... H01L 25/0652; H01L 24/19; H01L 21/568; H01L 23/5389; H01L 24/20; H01L 24/96; H01L 25/50; H01L 2224/12105; H01L 2224/92224; H01L 2224/16146; H01L 2224/73267; H01L 2224/32145; H01L 2224/73204; H01L 2224/92225; H01L 2224/13025; H01L 2924/15311; H01L 2224/92244; H01L 2224/73253; H01L 2224/17181; H01L 2225/06541; H01L 2225/06517; H01L 2224/83005; H01L 2224/73259; H01L 2224/32225; H01L 2224/16227; H01L 2224/81005; H01L 2225/06513

See application file for complete search history.

(56) References Cited

U.S. PATENT DOCUMENTS 7,294,529 B2  11/2007  Tuominen
8,803,332 B2   8/2014  Lee
(Continued)

*Primary Examiner* — Kyoung Lee
(74) *Attorney, Agent, or Firm* — McAndrews, Held & Malloy, Ltd.

(57) ABSTRACT

An electronic device and a method of making an electronic device. As non-limiting examples, various aspects of this disclosure provide various electronic devices, and methods of making thereof, that comprise a permanently coupled carrier that enhances reliability of the electronic devices.

22 Claims, 7 Drawing Sheets

(51) Int. Cl.
*H01L 23/538* (2006.01)
*H01L 23/00* (2006.01)
*H01L 25/00* (2006.01)

(52) U.S. Cl.
CPC .......... *H01L 2224/73204* (2013.01); *H01L 2224/73253* (2013.01); *H01L 2224/73259* (2013.01); *H01L 2224/73267* (2013.01); *H01L 2224/81005* (2013.01); *H01L 2224/83005* (2013.01); *H01L 2224/92224* (2013.01); *H01L 2224/92225* (2013.01); *H01L 2224/92244* (2013.01); *H01L 2225/06513* (2013.01); *H01L 2225/06517* (2013.01); *H01L 2225/06541* (2013.01); *H01L 2924/15311* (2013.01)

(56) References Cited

U.S. PATENT DOCUMENTS

| | | |
|---|---|---|
| 9,818,721 B2 | 11/2017 | Paek et al. |
| 2004/0063268 A1 | 4/2004 | Noma |
| 2007/0287265 A1 | 12/2007 | Hatano |
| 2012/0220082 A1 | 8/2012 | Ng |
| 2013/0052777 A1* | 2/2013 | Xu ................. H01L 21/561 438/127 |
| 2013/0217188 A1 | 8/2013 | Wang |
| 2016/0276309 A1 | 9/2016 | Paek et al. |

\* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a continuation of U.S. application Ser. No. 15/070,368, filed Mar. 15, 2016, expected to issue as U.S. Pat. No. 9,818,721 on Nov. 14, 2017 and titled "SEMICONDUCTOR DEVICE AND MANUFACTURING METHOD THEREOF," which makes reference to, claims priority to, and claims the benefit of Korean Patent Application No. 10-2015-0035939, filed on Mar. 16, 2015, in the Korean Intellectual Property Office and titled "SEMICONDUCTOR DEVICE AND MANUFACTURING METHOD THEREOF," the contents of each of which are hereby incorporated herein by reference in their entirety.

BACKGROUND

Present semiconductor packages and methods for forming semiconductor packages are inadequate, for example resulting in excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
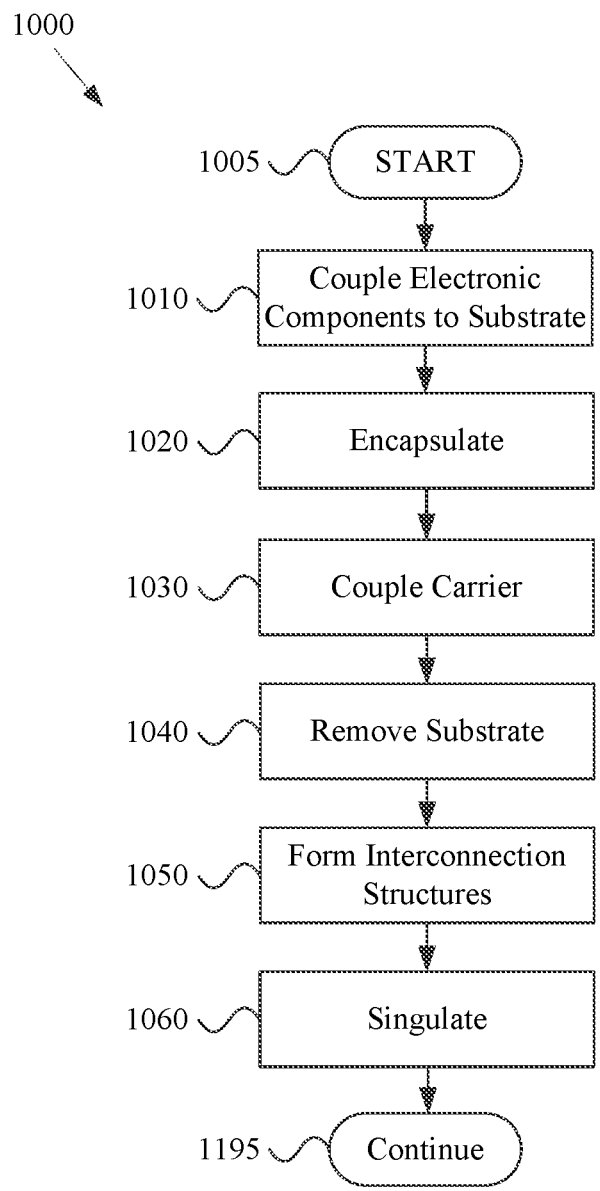
FIG. 1 shows a flow diagram of an example method of making an electronic device, in accordance with various aspects of the present disclosure.

Various aspects of this disclosure provide an electronic device and a method of making an electronic device. As non-limiting examples, various aspects of this disclosure provide various electronic devices, and methods of making thereof, that comprise a permanently coupled carrier that enhances reliability of the electronic devices.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

Various aspects of the present disclosure provide an electronic device (e.g., a semiconductor device) and a manufacturing method thereof, including a stable support structure for semiconductor die and/or other electronic components that for example suppresses or inhibits warpage.

Various aspects of the present disclosure provide an electronic device including a first semiconductor die (e.g., a single die, a stack of die, etc.) having a top surface or side (e.g., a planar top surface) and a bottom surface or side (e.g., a planar bottom surface) and including first conductive pads on the bottom surface, a second semiconductor die (e.g., a single die, a stack of die, etc.) spaced apart (e.g., laterally apart) from the first semiconductor die and having a top surface or side (e.g., a planar top surface) and a bottom surface or side (e.g., a planar bottom surface) and including second conductive pads on the bottom surface, an encapsulant (e.g., molding material or other encapsulating material) encapsulating side surfaces of the first semiconductor die and the second semiconductor die, and a carrier attached to the top surfaces of the first semiconductor die and the second semiconductor die and providing support for the first semiconductor die and the second semiconductor die.

In accordance with various aspects of the present disclosure, the carrier may, for example, be or comprise silicon (Si). The carrier may also, for example, be or comprise metal. Such metal may, for example, have a lower thermal coefficient of expansion (TCE) than copper (Cu). The carrier may, for example, comprise a thickness greater than 100 µm. The carrier may also, for example, comprise a thickness greater than 75 µm. The carrier may, for example, be coupled to (e.g., directly coupled to, indirectly coupled to, attached to, etc.) the top surfaces of the first and second semiconductor dies with adhesive (e.g., an adhesive layer).

In an example implementation, the first semiconductor die may be or include a logic chip (e.g., a processor die, controller die, co-processor die, application-specific integrated circuit die, programmable logic die, discrete logic die, etc.) and the second semiconductor die may be or include one or more memory chips.

In an example implementation, the electronic device may further include interconnection structures (e.g., solder balls or bumps, metal posts or pillars, pads, leads, wires, etc.) electrically and/or mechanically connected to the first conductive pad and the second conductive pad.

In accordance with various aspects of the present disclosure, the electronic device may include a substrate (e.g., an interposer, etc.) on the bottom surfaces of the first semiconductor die and the second semiconductor die and having a top surface or side (e.g., a planar top surface) and a bottom surface or side (e.g., a planar bottom surface), wherein the substrate includes conductive vias (e.g., straight through vias, redistribution layer(s), conductive paths comprising multiple conductive layers and vias, etc.) passing through the substrate from its top surface to its bottom surface. Each of the conductive vias may, for example, be electrically connected to a respective one of the first conductive pad and the second conductive pad. Such electronic device may further include interconnection structures (e.g., solder balls or bumps, metal posts or pillars, pads, leads, wires, etc.) electrically and/or mechanically connected to the conductive vias.

Various aspects of the present disclosure provide a method of manufacturing an electronic device (e.g., semiconductor device, etc.), the manufacturing method including coupling (e.g., directly coupling, indirectly coupling, attaching, etc.) a first semiconductor die (e.g., a single die, a stack of die, etc.) and a second semiconductor die (e.g., a single die, a stack of die, etc.) to the top surface of a substrate (e.g., an interposer, etc.), the first semiconductor die having a top surface or side (e.g., a planar top surface) and a bottom surface or side (e.g., a planar bottom surface) and including first conductive pads on its bottom surface, and the second semiconductor die spaced apart from the first semiconductor die, having a top surface or side (e.g., a planar top surface) and a bottom surface or side (e.g., a planar bottom side) and including second conductive pads on its bottom surface, encapsulating side surfaces of the first semiconductor die and the second semiconductor die using an encapsulant, attaching a carrier to the top surfaces of the first semiconductor die and the second semiconductor die, and removing the substrate.

In accordance with various aspects of the present disclosure, the carrier may, for example, be or comprise silicon (Si). The carrier may also, for example, be or comprise metal. Such metal may, for example, have a lower thermal coefficient of expansion (TCE) than copper (Cu). The carrier may also, for example, comprise a thickness greater than 100 µm. The carrier may, for example, be coupled to (e.g., directly coupled to, indirectly coupled to, attached to, etc.) the top surfaces of the first and second semiconductor dies with adhesive (e.g., an adhesive layer).

The removing of the substrate may include removing some or all of the substrate in any of a variety of manners (e.g., by grinding, thermal releasing, mechanical peeling, chemically etching, etc.). Such removing may, for example, expose the first conductive pad and the second conductive pad to the outside.

The manufacturing method may, for example, include attaching interconnection structures (e.g., solder balls or bumps, metal posts or pillars, pads, leads, wires, etc.) to the first conductive pad and the second conductive pad.

Various aspects of the present disclosure provide a method of manufacturing an electronic device (e.g., an semiconductor device, etc.), the manufacturing method including coupling (e.g., directly coupling, indirectly coupling, attaching, etc.) a first semiconductor die (e.g., a single die, a stack of die, etc.) and a second semiconductor die (e.g., a single die, a stack of die, etc.) to the top surface of a substrate (e.g., an interposer, etc.), the first semiconductor die having a top surface or side (e.g., a planar top surface) and a bottom surface or side (e.g., a planar bottom surface) and including first conductive pads on its bottom surface, and the second semiconductor die spaced apart from the first semiconductor die, having a top surface or side (e.g., a planar top surface) and a bottom surface or side (e.g., a planar bottom surface) and including second conductive pads on its bottom surface, encapsulating side surfaces of the first semiconductor die and the second semiconductor die using an encapsulant, attaching a carrier to the top surfaces of the first semiconductor die and the second semiconductor die, thinning (e.g., back grinding, etc.) a bottom surface of the substrate, and forming conductive vias (or other conductive signal distribution structures) through the thinned substrate.

In accordance with various aspects of the present disclosure, the carrier may, for example, be or comprise silicon (Si). The carrier may also, for example, be or comprise metal. Such metal may, for example, have a lower thermal coefficient of expansion (TCE) than copper (Cu). The carrier may also, for example, comprise a thickness greater than 100 µm. The carrier may, for example, be coupled to (e.g., directly coupled to, indirectly coupled to, attached to, etc.) the top surfaces of the first and second semiconductor dies with adhesive (e.g., an adhesive layer).

In the thinning of the substrate, the substrate may for example be thinned to have a thickness of about 10 µm to 30 µm. In the forming of the conductive vias (or other signal distribution structures), vias passing through the substrate (e.g., formed after the thinning, formed prior to the thinning for example in a back end of line (BEOL) redistribution structure forming process, etc.) from the top surface to the bottom surface of the substrate may be formed and the vias may be filled with a conductive material.

The manufacturing method may, for example, include attaching interconnection structures (e.g., solder balls or bumps, metal posts or pillars, pads, leads, wires, etc.) to the conductive vias.

As described above, in an electronic device in accordance with various aspects of the present disclosure, a carrier may be formed on a first semiconductor die and a second semiconductor die, thereby inhibiting or suppressing warpage while stably supporting the first semiconductor die and the second semiconductor die. Such a carrier may also, for example, efficiently emit heat generated by the first semiconductor die and the second semiconductor die to the outside.

The above and other aspects of the present disclosure will be described in or be apparent from the following description of various example implementations. Various aspects of the present disclosure will now be presented with reference to accompanying drawings, such that those skilled in the art may readily practice the various aspects.

FIG. 1 shows a flow diagram of an example method 1000 of making an electronic device, in accordance with various aspects of the present disclosure. The example method 1000 may, for example, share any or all characteristics with any other method discussed herein (e.g., the example method 3000 of FIG. 3, etc.). FIGS. 2A-2E show cross-sectional views illustrating example electronic devices and example methods of making an electronic device, in accordance with various aspects of the present disclosure. The structures shown in 2A-2E may share any or all characteristics with analogous structures shown in FIGS. 4A-4C. FIGS. 2A-2E may, for example, illustrate an example electronic device at various stages (or blocks) of the example method 1000 of FIG. 1. FIGS. 1 and 2A-2E will now be discussed together. It should be noted that the order of the example blocks of the example method 1000 may vary without departing from the scope of this disclosure.

The example method 1000 may, at block 1010, comprise coupling a first one or more electronic components (e.g., one or more semiconductor dies) and a second one or more electronic components (e.g., one or more semiconductor dies) to a substrate. The electronic components may, for example, be presented herein in the form of semiconductor dies. Such presentation is for illustrative purposes and not for limitation. For example, the electronic components may comprise active components, passive components, digital components, analog components, hybrid analog/digital components, etc.

The first and second semiconductor die(s) (or electronic components) may comprise any of a variety of characteristics, non-limiting examples of which are provided herein. For example, the first one or more (e.g., at least one) semiconductor die may comprise a single die, a vertical stack of multiple dies, etc. In a stack implementation, each die of a stack of die may for example be coupled to each other utilizing any of a variety of structures (e.g., conductive through-silicon via (TSV) structures, etc.). The first one or more semiconductor dies may include a top surface (e.g., a planar top surface, etc.), a bottom surface (e.g., a planar bottom surface, etc.), and a plurality of side surfaces (e.g., planar side surfaces, etc.) between the top surface and the bottom surface. Also, each of the first one or more semiconductor dies may include a top surface (e.g., a planar top surface, etc.), a bottom surface (e.g., a planar bottom surface, etc.), and a plurality of side surfaces (e.g., planar side surfaces, etc.) between the top surface and the bottom surface. The second one or more semiconductor dies may also comprise a single die, a vertical stack of multiple dies, etc. The second one or more semiconductor dies may include a top surface (e.g., a planar top surface, etc.), a bottom surface (e.g., a planar bottom surface, etc.) and a plurality of side surfaces (e.g., planar side surfaces, etc.) between the top surface and the bottom surface. Also, each of the second one or more semiconductor dies may include a top surface (e.g., a planar top surface, etc.), a bottom surface (e.g., a planar bottom surface, etc.), and a plurality of side surfaces (e.g., planar side surfaces, etc.) between the top surface and the bottom surface.

The first semiconductor die(s) and/or the second semiconductor die(s) may, for example, be or comprise silicon or semiconductor material. For example, the first and/or second semiconductor die(s) may comprise logic circuitry (e.g., discrete logic circuitry, processor circuitry, application specific integrated circuitry, programmable logic circuitry, etc.), memory circuitry (e.g., random access memory, read only memory, EEPROM circuitry, flash memory circuitry, memory stick memory, etc.), analog circuitry, digital and/or analog power supply circuitry, hybrid analog/digital circuitry, etc.

The first semiconductor die(s) may, for example, include one or more first conductive pads. Such first conductive pads may, for example, be on the bottom surface (or bottom side) of the first semiconductor die(s). Similarly for example, the second semiconductor die(s) may include one or more second conductive pads. Such second conductive pads may, for example, be on the bottom surface (or bottom side) of the second semiconductor die(s). Note that in an example implementation in which a stack of dies are utilized, each die of the stack may have such conductive pads. The conductive pads may, for example, be or comprise copper, aluminum, nickel, silver, gold, any of a variety of conductive metals or other materials, any combination thereof, etc. Note that the first conductive pad(s) of the first semiconductor die(s) and the second conductive pad(s) of the second semiconductor die(s) may be on other sides of their respective die(s) and/or may be on different respective sides of their respective die(s).

The substrate may comprise any of a variety of characteristics, non-limiting examples of which are provided herein. For example, the substrate may comprise a circuit board material (e.g., FR-4 glass epoxy, G-10 woven glass and epoxy, FR-n with n=1 to 6, CEM-m with m=1 to 4, laminate, laminate thermoset resin, copper-clad laminate, resin impregnated B-state cloth (pre-preg), polytetrafluoroethylene, combinations thereof, equivalents thereof, etc.). The substrate may comprise one or more layers of any of a variety of dielectric materials, for example inorganic dielectric material (e.g., $Si_3N_4$, $SiO_2$, SiON, SiN, oxides, nitrides, etc.) and/or organic dielectric material (e.g., a polymer, polyimide (PI), benzocyclobutene (BCB), polybenzoxazole (PBO), bismaleimide triazine (BT), a molding material, a phenolic resin, an epoxy, etc.), but the scope of the present disclosure is not limited thereto. The substrate may, for example, comprise silicon or any of a variety of semiconductor materials. The substrate may also, for example, comprise a glass or metal plate (or wafer). The substrate may be any of a variety of configurations. For example, the substrate may be wafer or panel form. The substrate may also, for example, be in diced or singulated form. The substrate may also be referred to herein as an interposer.

The substrate may, for example, be or comprise a bulk material with no conductive routing paths. Alternatively for example, the substrate may comprise one or more conductive layers, vias, and or signal distribution structures. For example, the substrate may, for example, comprise conductive vias extending into the substrate from the top surface thereof to or toward the bottom surface thereof. For example, the substrate may comprise a single or multi-layer signal distribution structure (e.g., in example implementations in which the entire substrate is not later removed, etc.).

The first one or more semiconductor dies and the second one or more semiconductor dies may be positioned laterally (e.g., horizontally) apart from each other. There may, for example, be an empty space between the first die(s) and the second die(s). In an example implementation, there might be no electronic components mounted to the substrate between the first die(s) and the second die(s). Note that although only two sets of one or more semiconductor dies (or components) are discussed herein for an electronic device, this is for illustrative clarity only and not limitation. For example, a third one or more semiconductor dies, a fourth one or more semiconductor dies, etc. may also be coupled to the substrate and also spaced laterally apart from the other die (or components). The spacing of such die (or other electronic components) may, for example, be one-dimensional along a single line or two-dimensional (e.g., in a two-dimensional matrix form looking down on the substrate). A third-dimension may, for example, be provided by component stacking.

At this point, the top surface of the first one or more semiconductor dies may be coplanar with the top surface of the second one or more semiconductor dies. The top surface of the first one or more semiconductor dies may have the same height above the substrate as the top surface of the second one or more semiconductor dies. This need not, however, be the case. As will be discussed herein, if coplanarity of such top surfaces is desired and not provided during the coupling process, a planarization process may be performed. Note also that one of more of the lateral sides of the first one or more semiconductor dies and of the second one or more semiconductor dies may be planar and parallel with each other.

Block 1010 may comprise preparing the die (or other component(s)) and/or substrate for the coupling process. Such preparing may, for example, comprise receiving the die and/or substrate from an upstream manufacturing process, receiving the die and/or substrate from shipping, etc. Such preparing may, for example, comprise forming or otherwise preparing interconnection structures on the die (or components) and/or substrate. Such preparing may, for example, comprise dicing or singulating the die. Such preparing may, for example, comprise forming signal distribution structures where needed. Such preparing may, for example, comprise performing cleaning, planarizing, etc.

Block 1010 may comprise coupling the first and second semiconductor die (or other electronic components) to the substrate in any of a variety of manners, non-limiting examples of which are provided herein. For example, block 1010 may comprise coupling (or attaching) the semiconductor die to the substrate utilizing a layer of adhesive (e.g., applying a preformed adhesive tape or sheet or film, printing or otherwise depositing a layer of liquid or paste adhesive, etc.) to the substrate and/or the dies, and then positioning the dies. For example, the adhesive may entirely coat the top side of the substrate and/or might only coat the bottom sides of the dies. The adhesive may, for example, comprise a releasable adhesive (e.g., a thermally and/or chemically releasable adhesive, a light-releasable adhesive, etc.). Also for example, block 1010 may comprise utilizing a reflow process to attach the semiconductor dies to the substrate. As discussed herein, the substrate may be prepared in the form of a wafer or panel of such substrates, but may also be prepared in single form.

Figure 2A:
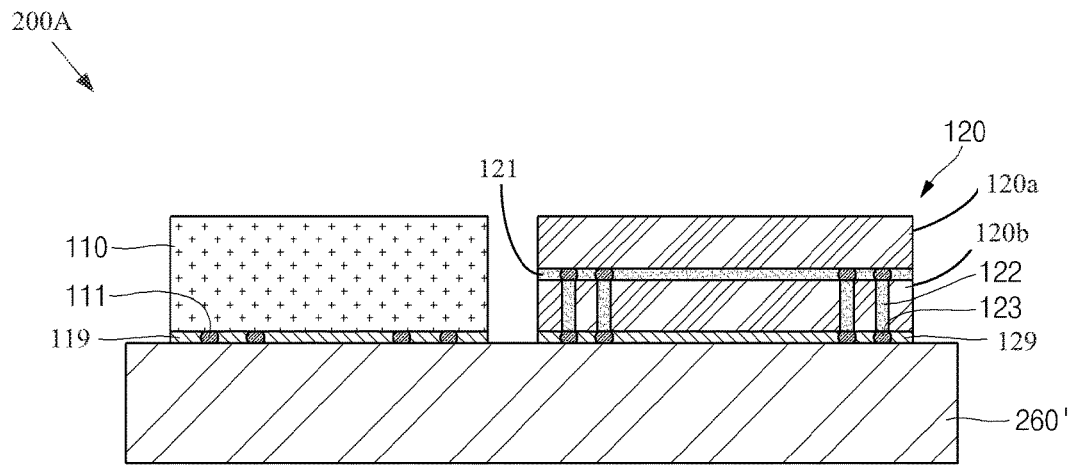
FIGS. 2A-2E show cross-sectional views illustrating example electronic devices and example methods of making an electronic device, in accordance with various aspects of the present disclosure.

An example implementation 200A showing various aspects of block 1010 is shown at FIG. 2A. The example implementation 200A (or assembly, sub-assembly, package, etc.) comprises a substrate 260'. The first semiconductor die 110 comprises first conductive pads 111 on a bottom surface (or side) thereof. The first semiconductor die 110 is coupled (or attached) to the substrate 260' with a first adhesive layer 119.

The example implementation 200A also comprises a stack of second semiconductor dies 120 comprises a top stacked die 120a and a bottom stacked die 120b. The top stacked die 120a and the bottom stacked die 120b are electrically and/or mechanically coupled to each other (e.g., utilizing a reflow process, utilizing conductive adhesive, etc.). Conductive paths 122 (e.g., conductive vias, conductive through-silicon vias, general signal distribution structures, etc.) provide electrical connectivity between the stacked die and/or between any or all of the stacked die and the second conductive pads 123. There may also, for example, be an underfill 121 between each of the stack of second semiconductor dies 120.

The bottom stacked die 120b comprises second conductive pads 123 on the bottom surface (or side) thereof. The second semiconductor die(s) 120 is coupled (or attached) to the substrate 260' with a second adhesive layer 129. Note that the first adhesive layer 119 and the second adhesive layer 129 may be separate adhesive layers that correspond to their respective semiconductor dies. In another example implementation, however, the first adhesive layer 119 and the second adhesive layer 129 may be respective portions of a single continuous adhesive layer (e.g., formed on the substrate 260' prior to placement of the first semiconductor die(s) 110 and second semiconductor die(s) 120). In such an example implementation, there may also be adhesive on the top surface of the substrate 260' laterally between the first semiconductor die(s) 110 and second semiconductor die(s) 120.

In the example implementation 200A, the top surface (or side) of the first one or more semiconductor dies 110 is coplanar with the top surface (or side) of the top stacked die 120a. The top surface of the first one or more semiconductor dies 110 has the same height above the substrate 260' as the top surface of the second one or more semiconductor dies 120. As explained herein, this need not be the case, for example at block 1010, and if such coplanarity is desired, a planarization process may be performed at some point during the method 1000.

Block 1010 generally comprises coupling a first one or more electronic components (e.g., one or more semiconductor dies) and a second one or more electronic components (e.g., one or more semiconductor dies) to a substrate. Accordingly, the scope of this disclosure should not be limited by characteristics of any particular type of electronic component (or semiconductor die), any particular type of substrate, and/or any particular manner of coupling such components to the substrate.

The example method 1000 may, at block 1020, comprise encapsulating the electronic components and/or substrate of block 1010. Block 1020 may, for example, comprise performing such encapsulating in any of a variety of manners, non-limiting examples of which are provided herein.

Block 1020 may, for example, comprise forming encapsulating material to cover at least any or all lateral side surfaces of the first one or more semiconductor dies and the second one or more semiconductor dies. For example, the top and bottom surfaces (or sides) of the first one or more semiconductor dies and of the second one or more semiconductor dies may remain uncovered by the encapsulating material. Block 1020 may also, for example, comprise forming the encapsulating material to cover a top surface (or side) of the first semiconductor die(s) and/or of second semiconductor dies(s). Block 1020 may further, for example, comprise forming the encapsulating material to cover a top side of the substrate 260' (e.g., portion of the substrate 260' not already covered by the components. The encapsulating material may, for example, directly contact such covered surfaces, but there may also be one or more intervening layers of material. In an example scenario in which the substrate 260' is in wafer form, block 1020 may comprise covering the top side of the wafer (e.g., all or at least portions of the wafer on which components are mounted, etc.) with the encapsulating material.

The encapsulating material may, for example, protect the encapsulated components (or encapsulated portions thereof)

from external environmental conditions. As discussed herein, the encapsulating material may also provide a base on which to mount a carrier and/or other components.

The encapsulating material may comprise any of a variety of encapsulating or molding materials (e.g., resin, polymer, polymer composite material (e.g., epoxy resin with filler, epoxy acrylate with filler, or polymer with a proper filler), etc. Block 1020 may comprise performing the encapsulating in any of a variety of manners (e.g., compression molding, transfer molding, liquid encapsulant molding, vacuum lamination, paste printing, film assisted molding, etc.).

In various example implementations presented herein, the encapsulating material may have a top surface that is coplanar with the top surfaces of the first one or more semiconductor die(s) and the second one or more semiconductor die(s). Such an example configuration may be formed during the encapsulating or after the encapsulating. For example, in an example implementation, block 1020 refrains for forming encapsulating material on the semiconductor die top surfaces. In another example configuration, block 1020 comprises forming the encapsulating material over the top surfaces of one or more of the semiconductor dies, and then comprises performing a thinning process (e.g., grinding, chemical-mechanical planarization or polishing (CMP), etching, etc.) to planarize the top surface of the encapsulating material and/or the top die surfaces.

Figure 2B:
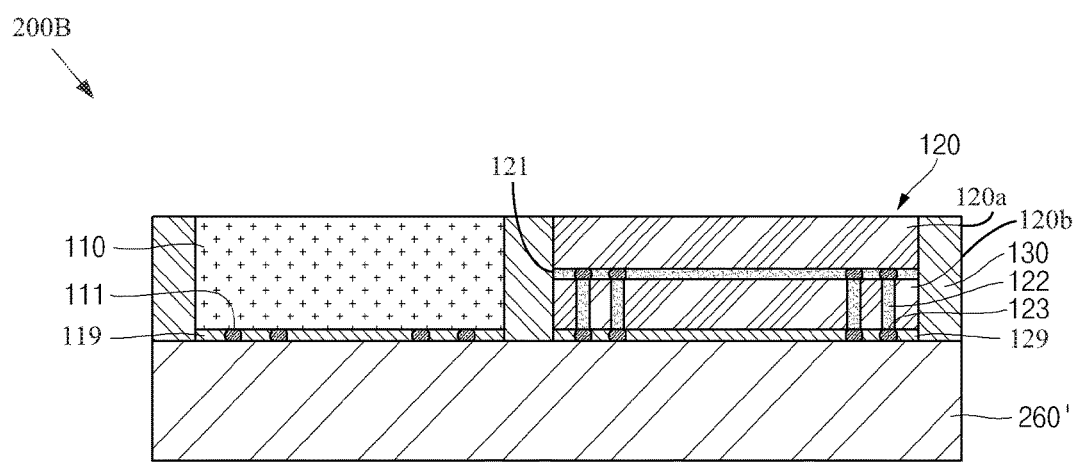

An example implementation 200B showing various aspects of block 1020 is shown at FIG. 2B. The example implementation 200B (or assembly, sub-assembly, package, etc.) comprises an encapsulating material 130. The encapsulating material 130 is shown encapsulating or covering lateral side surfaces of the first semiconductor die(s) 110, lateral side surfaces of the first adhesive layer 119, lateral side surfaces of the second semiconductor die(s) 120, lateral side surfaces of the second adhesive layer 129, and the top side of the substrate 260'.

In general, block 1020 may comprise encapsulating the components and/or substrate of block 1010. Accordingly, the scope of this disclosure should not be limited by characteristics of any particular amount of encapsulating, particular encapsulating material, and/or particular manner of performing the encapsulating.

The example method 1000 may, at block 1030, comprise coupling a carrier to at least the top surface (or side) of the first one or more semiconductor dies (or electronic component(s)) and/or the top surfaces (or side) of the second one or more semiconductor dies (or electronic component(s)). Block 1030 may, for example, comprise permanently coupling (or attaching) the carrier. For example, the carrier may be a part of the completed electronic device. Block 1030 may comprise performing such carrier coupling in any of a variety of manners, non-limiting examples of which are provided herein.

Block 1030 may, for example, comprise coupling the carrier to a top surface of the first one or more semiconductor dies and/or to a top surface of the second one or more semiconductor dies. As discussed herein, the top surfaces of such semiconductor dies may be exposed to the outside from the encapsulating material formed at block 1020. Block 1030 may comprise coupling the carrier to such exposed top surfaces. Block 1030 may also, for example, comprise coupling the carrier to the top surface of the encapsulating material formed at block 1020. In an example implementation, block 1030 may comprise coupling the carrier in a wafer or panel form, and thus the entire top surface of the electronic device (or a wafer comprising multiple electronic devices) may be covered by the carrier.

The carrier may, for example, provide support when the substrate is removed (or thinned) at block 1040. Such support may, for example, be beneficial after completion of the electronic device. The carrier may also assist with the dissipation of heat generated by the die (or components) of the completed electronic device. In various example implementations, however, the carrier material may be selected with an emphasis on support or structural stability, rather than heat dissipation. For example, the carrier may be or comprise a material having a relatively low coefficient of thermal expansion (CTE) even if it has relatively poor thermal conductivity, for example rather than a metal having high thermal conductivity.

In an example implementation, the carrier may be or comprise silicon (or other semiconductor material). Such a carrier material may, for example, provide support while generally matching the coefficient of thermal expansion (CTE) of the semiconductor dies (or components) coupled at block 1010. Such a silicon carrier might, for example, comprise only bulk silicon. Also, such a silicon carrier may comprise one or more electrically conductive or heat conductive pathways (e.g., vias) therethrough.

In another example implementation, the carrier may be or comprise metal. In such an example implementation, the carrier may be or comprise a metal having a lower CTE than copper (Cu). The carrier may, for example, prevent or inhibit warpage from occurring due to a difference in the CTE between the carrier and each of the first one or more semiconductor dies (or components) and the second one or more semiconductor dies (or components).

In an example implementation, the carrier may have a thickness greater than 100 μm and less than 150 μm. In another example implementation, the carrier may have a thickness in the range of 50 μm to 100 μm.

Block 1030 may comprise coupling (or attaching) the carrier in any of a variety of manners. For example, block 1030 may comprise attaching the carrier utilizing adhesive (e.g., a layer thereof). Block 1030 may comprise forming a layer of adhesive on the carrier and applying the carrier. Block 1030 may also (e.g., instead of or in addition to forming a layer of adhesive on the carrier) comprise forming a layer of adhesive on the top surfaces (or sides) of the first one or more semiconductor dies, second one or more semiconductor dies, and/or the top surface of the encapsulating material.

Block 1030 may comprise forming the layer(s) of adhesive in any of a variety of manners. For example, block 1030 may comprise applying a preformed adhesive tape or sheet or film. Also for example, block 1030 may comprise printing or otherwise depositing an adhesive paste or liquid. Block 1030 may, for example, comprise forming the adhesive on a wafer or panel (e.g., a wafer or panel of the carrier, a wafer or panel of electronic device assemblies, etc.). In various example implementations, the adhesive may comprise a permanent adhesive. Note that block 1030 may, for example, comprise utilizing a different adhesive than utilized by block 1010 for the die (or component) attachment, but this need not be the case. Block 1030 may comprise coupling (or attaching) the carrier utilizing any of a variety of mechanical and/or chemical techniques.

Figure 2C:
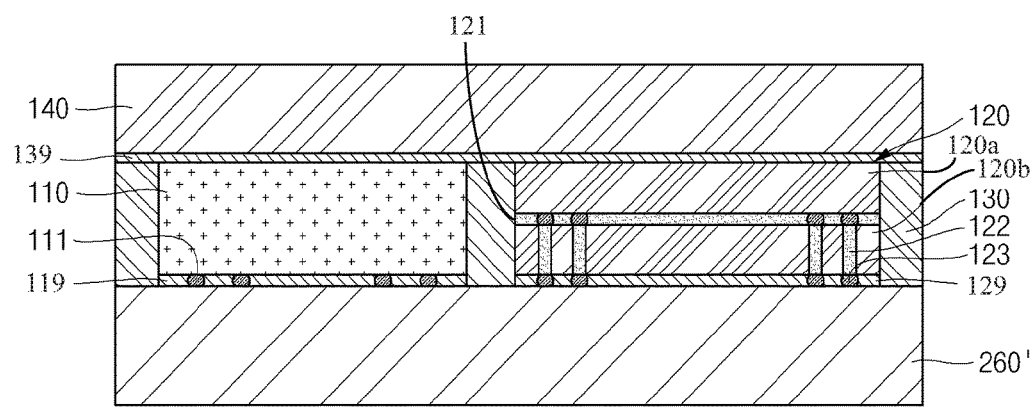

An example implementation 200C of block 1030 is shown at FIG. 2C. The example implementation 200C (or assembly, sub-assembly, package, etc.) comprises a carrier 140. The carrier 140 is illustrated coupled to the top surface (or side) of the first one or more semiconductor dies 110, to the top surface (or side) of the second one or more semiconductor dies 120, and/or to the top surface (or side) of the encapsulating material 130. As shown, the bottom surface (or side) of the carrier 140 may be planar and parallel to the top surface (or side) of the first one or more semiconductor dies 110, to the top surface (or side) of the second one or more semiconductor dies 120, and/or to the top surface (or side) of the encapsulating material 130. As discussed herein, during attaching the carrier 140, any or all of the respective top surface (or side) of the first one or more semiconductor dies 110, to the top surface (or side) of the second one or more semiconductor dies 120, and/or to the top surface (or side) of the encapsulating material 130 may be co-planar.

The example method 1000 may, at block 1030, comprise coupling a carrier to at least the top surface (or side) of the first one or more semiconductor dies and/or the top surface (or side) of the second one or more semiconductor dies. Accordingly, the scope of this disclosure should not be limited by characteristics of any particular carrier and/or any particular manner of attaching a carrier.

The example method 1000 may, at block 1040, comprise removing the substrate (or interposer), for example to which the electronic components were coupled at block 1010. Block 1040 may comprise removing (or thinning) the substrate in any of a variety of manners, non-limiting examples of which are provided herein.

Block 1040 may, for example, comprise removing the substrate mechanically (e.g., by grinding, shearing, peeling, etc.), chemically (e.g., by etching, dissolving an adhesive utilized to attach the die (or components) to the substrate at block 1010, etc.), thermally (e.g., by applying heat to release a thermally releasable adhesive utilized at block 1010, etc.), utilizing light and/or other directed energy techniques to cause adhesive release, any combination thereof, any equivalent thereof, chemical/mechanical planarization (CMP), etc.

Block 1040 may, for example, comprise removing the substrate and/or adhesive (if used) to expose the first conductive pads on the bottom side of the first one or more semiconductor dies (or electronic component), to expose the second conductive pads on the bottom surfaces of the second one or more semiconductor dies (or electronic component), etc. As discussed herein (e.g., in the discussion of FIGS. 3 and 4, etc.), the entire substrate need not be removed.

After removal of the substrate at block 1040, the first one or more semiconductor dies, the second one or more semiconductor dies, and the encapsulating material are supported in a structurally stable manner by the carrier coupled at block 1030.

Figure 2D:
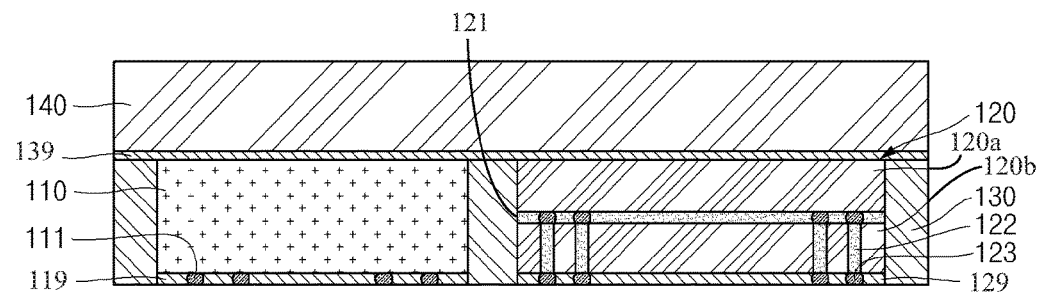

An example implementation 200D (or assembly, sub-assembly, package, etc.) of block 1040 is shown at FIG. 2D. Comparing the example implementation 200D of FIG. 2D to the example implementation 200C of FIG. 2C, the substrate 260' has been removed. Note that the first adhesive 119 and the second adhesive 129 may be left attached to the bottom sides of the first one or more semiconductor dies 110 and the second one or more semiconductor dies 120, respectively. For example, the first conductive pads 111 (e.g., at least lower ends thereof) may be exposed from the first adhesive layer 119, and the second conductive pads 123 (e.g., at least lower ends thereof) may be exposed from the second adhesive layer 129. In another example implementation, the first adhesive 119 and/or the second adhesive 129, or respective portions thereof, may be removed.

In general, block 1040 may comprise removing the substrate (or a portion thereof). Accordingly, the scope of various aspects of this disclosure should not be limited by characteristics of any particular manner of removing the substrate.

The example method 1000 may, at block 1050, comprise forming interconnection structures. Block 1050 may comprise performing such forming (and/or coupling) in any of a variety of manners, non-limiting examples of which are provided herein.

Block 1050 may, for example, electrically and/or mechanically coupling the interconnection structures to the first conductive pads of the first one or more semiconductor dies and/or to the second conductive pads of the second one or more semiconductor dies. Block 1050 may, for example, comprise forming the interconnection structures directly on the first and/or second conductive pads. As discussed herein, after removal of the substrate 260', the first and/or second conductive pads 119 and 129 may be exposed through the first and second adhesive layers 119 and 129 (if such adhesive layers remain). Such exposure provides for coupling the interconnection structures to such exposed conductive pads.

The interconnection structures may comprise any of a variety of characteristics. For example, the interconnection structures may comprise solder balls or bumps, metal posts or pillars, wires, leads, pads, etc. In an implementation including solder balls or bumps, such balls or bumps may comprise Sn—Pb, Sn—Pb—Ag, Sn—Pb—Bi, Sn—Cu, Sn—Ag, Sn—Bi, Sn—Ag—Cu, Sn—Ag—Bi, Sn—Zn, combinations thereof, equivalents thereof, etc., but the scope of this disclosures is not limited thereto. Block 1050 may comprise forming or attaching such interconnection structures by ball-dropping, bumping, metal-plating, pasting and reflowing, etc.

In an example implementation, the interconnection structures may comprise conductive posts or pillars comprising copper and/or nickel, and may comprise a solder cap (e.g., comprising tin and/or silver). For example, conductive structures comprising conductive pillars may comprise: (a) an under bump metallization ("UBM") structure that includes (i) a layer of titanium-tungsten (TiW) formed by sputtering (which may be referred to as a "seed layer"), and (ii) a layer of copper (Cu) on the titanium-tungsten layer formed by sputtering, (b) a copper post or pillar formed on the UBM by electroplating, and (c) a layer of solder formed on the copper pillar or a layer of nickel formed on the copper pillar with a layer of solder formed on the nickel layer.

Also, in an example implementation, the interconnection structures may comprise a lead and/or lead-free wafer bump or ball (e.g., Pb/Sn, leadless Sn, equivalents thereof, alloys thereof, etc.). For example, lead-free wafer bumps (or interconnect structures) may be formed, at least in part, by: (a) forming an under bump metallization (UBM) structure by (i) forming a layer of titanium (Ti) or titanium-tungsten (TiW) by sputtering, (ii) forming a layer of copper (Cu) on the titanium or titanium-tungsten layer by sputtering, (iii) and forming a layer of nickel (Ni) on the copper layer by electroplating; and (b) forming a lead free solder material on the nickel layer of the UBM structure by electroplating, wherein the lead free solder material has a composition by weight of 1% to 4% silver (Ag) and the remainder of the composition by weight is tin (Sn).

The interconnection structures may, for example, provide for the transfer of electrical signals between the first one or more semiconductor dies 110 and the second one or more semiconductor dies 120, and an external device.

Figure 2E:
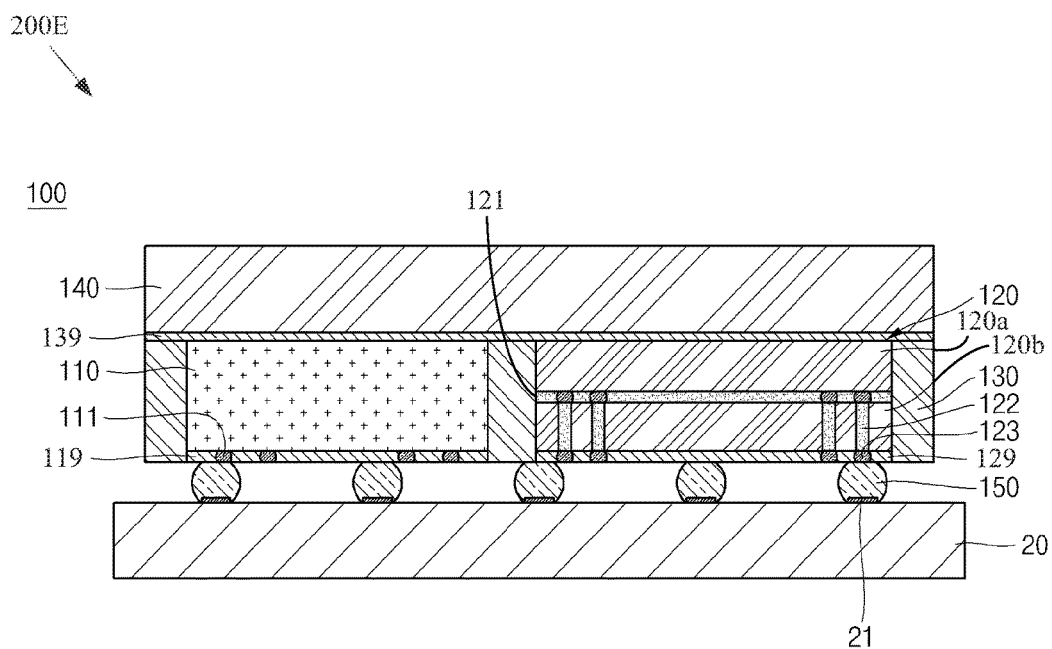

An example implementation 200E (or assembly, sub-assembly, package, etc.) of block 1050 is shown at FIG. 2E. The example implementation 200E shows example conductive interconnection structures 150.

In general, block 1050 may comprise forming interconnection structures. Accordingly, the scope of various aspects of this disclosure should not be limited by characteristics of any particular interconnection structure or by any particular manner of forming or coupling an interconnection structure.

The example method 1000 may, at block 1060, comprise singulating (or excising) the electronic device from a wafer or panel of such devices. Note that block 1060 may be skipped in an example implementation in which the electronic devices are formed independently, rather than on a wafer or panel. Block 1060 may comprise performing such singulating in any of a variety of manners, non-limiting examples of which are provided herein.

Block 1060 may, for example, comprise performing wafer or panel singulation utilizing any or a variety of mechanical and/or energy-based sawing techniques (e.g., a saw blade, laser or plasma cutting tool, nibbler, etc.).

An example implementation 200E (or assembly, subassembly, package, etc.) of block 1060 is shown at FIG. 2E. The example implementation 200E shows example electronic device 100 singulated from a panel of such devices. For example, the lateral sides of the example electronic device 100 are generally planar. For example, the lateral sides of the carrier 140, the third adhesive 139, and/or encapsulating material 130 may be co-planar. Also for example, in an implementation in which the first adhesive layer 119 and second adhesive layer 129 are portions of a same layer that covered the substrate 260', the lateral sides of such an adhesive layer may also be co-planar with the lateral sides of the carrier 140, the third adhesive 139, and/or encapsulating material 130.

In general, block 1060 may comprise singulating (or excising) the electronic device from a wafer or panel of such devices. Accordingly, the scope of various aspects of this disclosure should not be limited by characteristics of any particular manner of performing singulation.

The example method 1000 may, for example at block 1095, comprise performing continued processing. Such continued processing may comprise performing any of a variety of continued processing operations. For example, block 1095 may comprise performing further encapsulating operations, forming signal distribution structures, coupling the electronic device to other electronic devices, packaging, shipping, marking, etc.

An example implementation 200E (or assembly, subassembly, package, etc.) of an aspect of block 1095 is shown at FIG. 2E. The example implementation 200E shows the example electronic device 100 attached to a substrate 20 (e.g., a circuit board, a mother board, a packaging substrate of a multi-device module, another electronic device, etc.). For example the interconnection structures 150 may provide a mechanical and/or electrical connection between respective conductive pads 111 and 123 of the semiconductor dies and circuit patterns 21 of the substrate 20. Such attaching may, for example, be performed utilizing a reflow process, conductive adhesive, etc. Note that, although not shown, an underfill material (e.g., a capillary underfill, pre-applied underfill, molded underfill, etc.) may be formed between the electronic device 100 and the substrate 20.

Block 1095 may also, for example, comprise directing execution flow of the example method 1000 to any other block (or sub-block) of the example method 1000 or any other method discussed herein.

In general, block 1095 may comprise performing continued processing. Accordingly, the scope of various aspects of this disclosure should not be limited by characteristics of any particular manner of performing continued processing.

As explained in the discussion of FIGS. 1 and 2, the example method 1000 (e.g., at block 1040) need not remove the entirety of the substrate (or interposer). Various portions of the following discussion will address such an example scenario.

Figure 3:
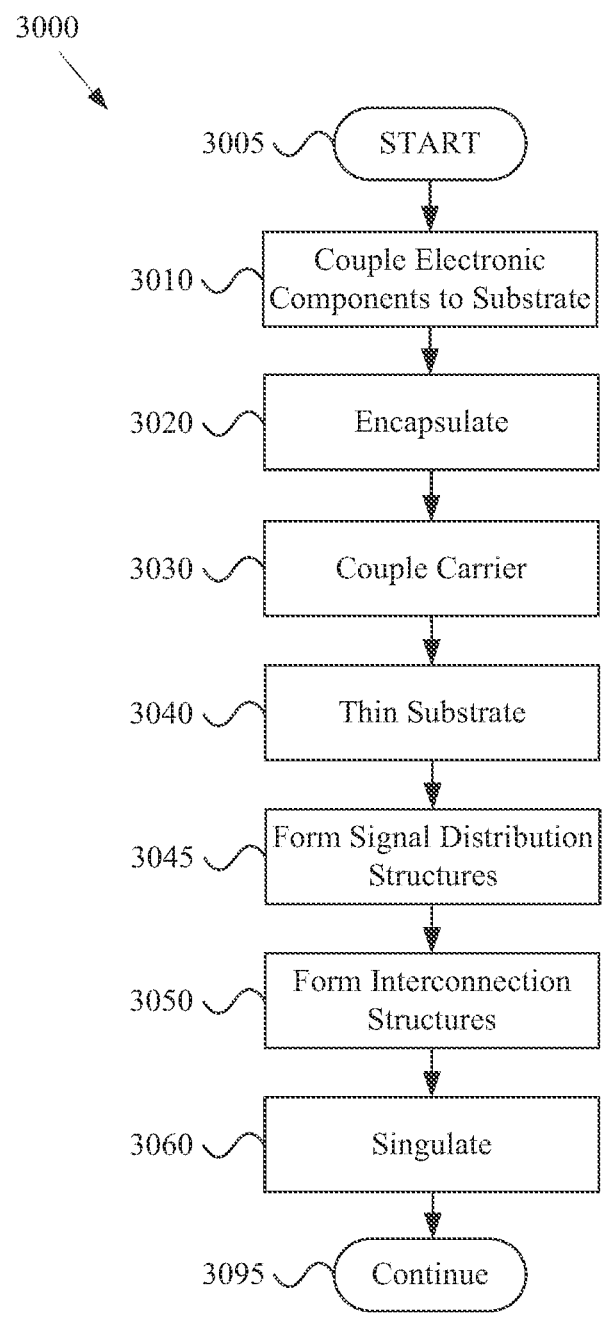
FIG. 3 shows a flow diagram of an example method of making an electronic device, in accordance with various aspects of the present disclosure.
Figure 4A:
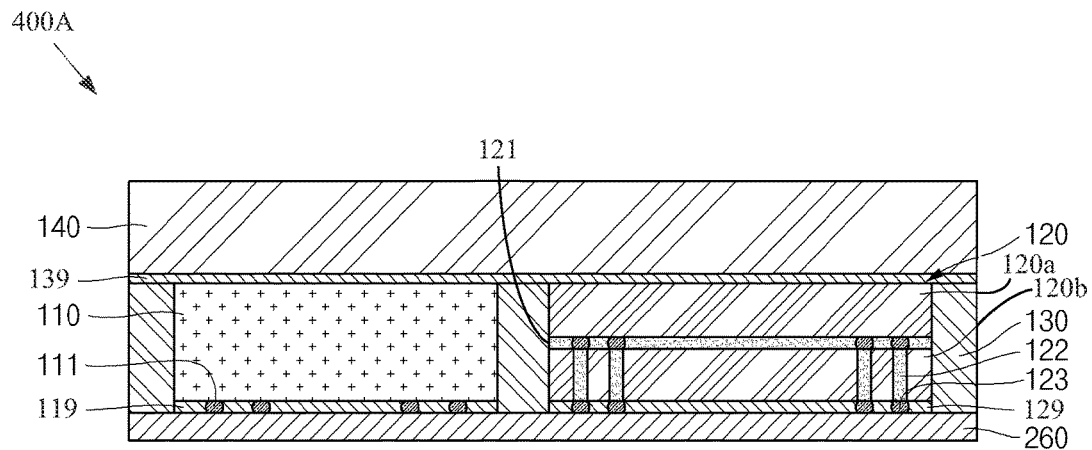
FIGS. 4A-4C show cross-sectional views illustrating example electronic devices and example methods of making an electronic device, in accordance with various aspects of the present disclosure.
Figure 4B:
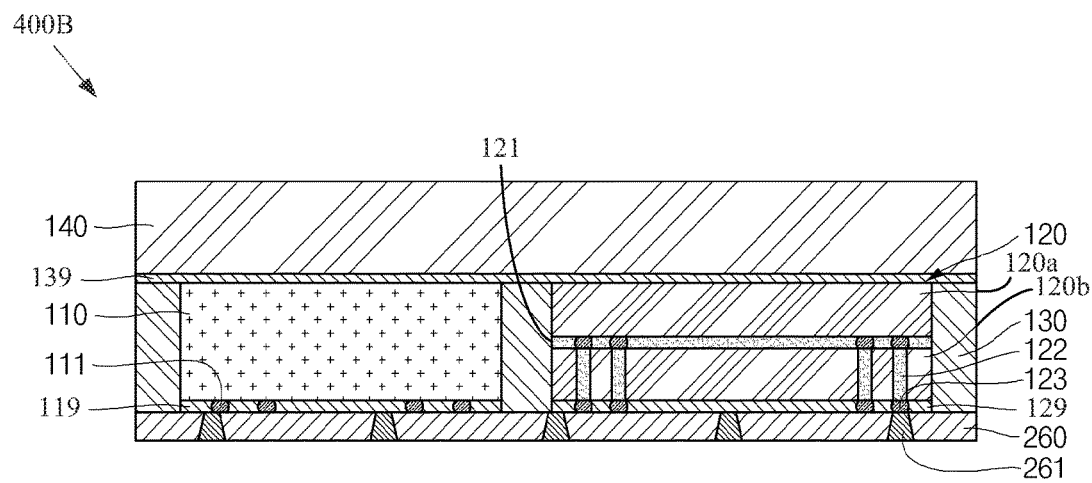
Figure 4C:
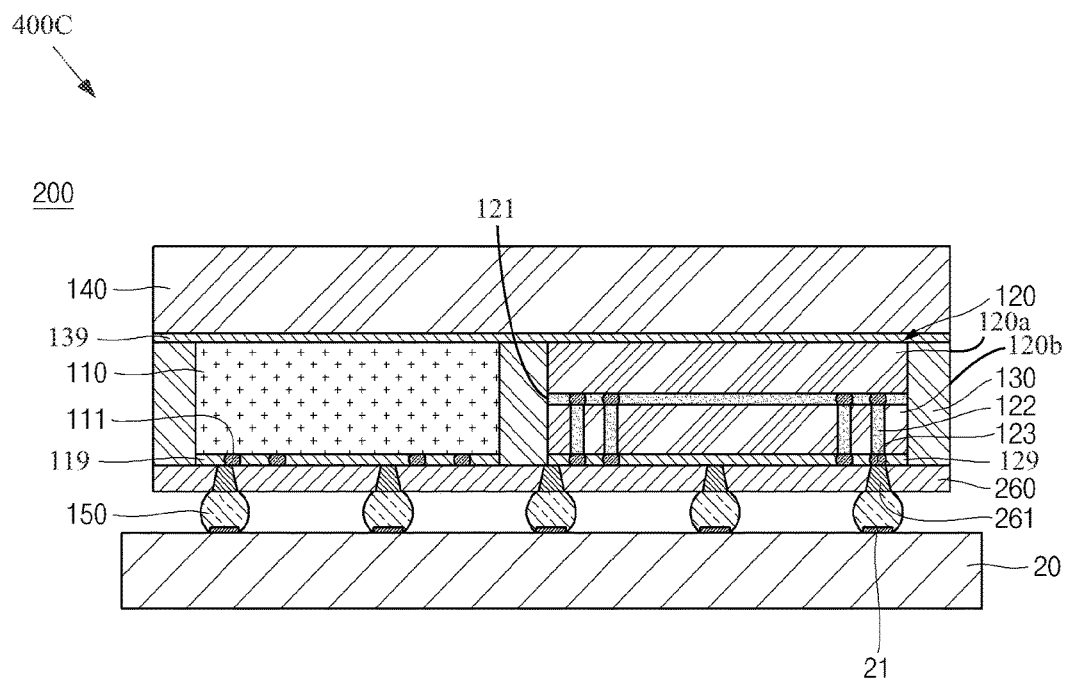

FIG. 3 shows a flow diagram of an example method 3000 of making an electronic device, in accordance with various aspects of the present disclosure. The example method 3000 may, for example, share any or all characteristics with any other method discussed herein (e.g., the example method 1000 of FIG. 1, etc.). FIGS. 4A-4C show cross-sectional views illustrating example electronic devices and example methods of making an electronic device, in accordance with various aspects of the present disclosure. The structures shown in 4A-4C may share any or all characteristics with analogous structures shown in FIGS. 2A-2E. FIGS. 4A-4C and FIGS. 2A-2E may, for example, illustrate an example electronic device at various stages (or blocks) of the example method 3000 of FIG. 3. FIGS. 3 and 4A-4C will now be discussed together. It should be noted that the order of the example blocks of the example method 3000 may vary without departing from the scope of this disclosure.

The example method 3000 may, at block 3010, comprise coupling a first one or more electronic components (e.g., one or more semiconductor dies) and a second one or more electronic components (e.g., one or more semiconductor dies) to a substrate. Block 3010 may, for example, share any or all characteristics with block 1010 of the example method 1000 shown in FIGS. 1 and 2, and discussed herein.

The example method 3000 may, at block 3020, comprise encapsulating the components and/or substrate of block 3010. Block 3020 may, for example, share any or all characteristics with block 1020 of the example method 1000 shown in FIGS. 1 and 2, and discussed herein.

The example method 3000 may, at block 3030, comprise coupling a carrier to at least the top surface (or side) of the first one or more semiconductor dies (or electronic component(s)) and/or the top surfaces (or side) of the second one or more semiconductor dies (or electronic component(s)). Block 3030 may, for example, share any or all characteristics with block 1030 of the example method 1000 shown in FIGS. 1 and 2, and discussed herein.

The example method 3000 may, at block 3040, comprise thinning the substrate (or interposer). Block 3040 may, for example, share any or all characteristics with block 1040 of the example method 1000 shown in FIGS. 1 and 2, and discussed herein.

As discussed herein, for example in the discussion of block 1040, the substrate (or interposer) may be entirely removed, but may also be thinned (e.g., leaving a remaining portion). Block 3040 may comprise thinning the substrate in any of a variety of manners, non-limiting examples of which are provided herein.

Block 3040 may, for example, comprise grinding the substrate (e.g., from the bottom side of the substrate opposite the top side to which the electronic components (e.g., semiconductor dies) were coupled at block 3010). Block 3040 may also, for example, comprise utilizing chemical etching (e.g., instead of or in addition to mechanical grinding or other material removal techniques). The remaining portion of the substrate after the thinning may, for example, have a thickness in the range of 10 μm to 30 μm (e.g., strictly or approximately). The remaining portion of the substrate may also, for example, have a thickness in the range of 30 μm to 50 μm (e.g., strictly or approximately).

After removal of a portion of the substrate at block 3040, the first one or more semiconductor dies, the second one or more semiconductor dies, and the encapsulating material are supported in a structurally stable manner by the carrier coupled at block 3030 in cooperation with a remaining portion of the substrate.

An example implementation 400A (or assembly, subassembly, package, etc.) of block 3040 is shown at FIG. 4A. Comparing the example implementation 400A of FIG. 4A to the example implementation 200C of FIG. 2C, a portion of the substrate 260' has been removed, leaving a remaining portion of the substrate 260. The remaining portion of the substrate 260 may, for example, have a thickness in the range of 10 µm to 30 µm (e.g., strictly or approximately) or a thickness in the range of 30 µm to 50 µm (e.g., strictly or approximately).

In general, block 3040 may comprise thinning the substrate (or interposer). Accordingly, the scope of various aspects of this disclosure should not be limited by characteristics of any particular manner of thinning the substrate or of any particular thinned substrate.

The example method 3000 may, at block 3045, comprise forming signal distribution structures through the thinned substrate. Block 3045 may comprise forming the signal distribution structures through the thinned substrate in any of a variety of manners, non-limiting examples of which are provided herein.

Block 3045 may, for example, comprise forming conductive vias through the thinned substrate, for example, forming apertures in the thinned substrate (e.g., by mechanically ablating, laser ablating, chemical etching, etc.) and extending to the conductive pads at the bottom of the dies (or electronic components) coupled at block 3010. Block 3045 may then, for example, comprise filling such apertures with conductive material (e.g., metal plating, solder paste, etc.). Such conductive vias are thus exposed at the bottom surface of the thinned substrate (e.g., for later connection to interconnection structures).

Note that in various example scenarios, the conductive via forming might be skipped. For example, in an example scenario in which the thinned substrate (e.g., the portion of the substrate remaining after thinning at block 3040) already comprises signal distribution structures (e.g., one or more conductive and dielectric layers, redistribution layers, etc.) extending through the thinned substrate, the conductive via formation might be skipped.

An example implementation 400B (or assembly, subassembly, package, etc.) of block 3045 is shown at FIG. 4B. The example implementation 400B, for example, may share any or all characteristics of the example implementation 200D shown in FIG. 2D. The example implementation 400B also, for example, comprises a thinned substrate 260 and conductive vias 261 extending through and providing conductive signal paths through the thinned substrate 260. The conductive vias 261 are electrically connected to the first conductive pads 111 and the second conductive pads 123, providing conductive signal pathways through the thinned substrate 260.

In general, block 3045 may comprise forming signal distribution structures through the thinned substrate. Accordingly, the scope of various aspects of this disclosure should not be limited by characteristics of any particular signal distribution structure or of any particular manner of forming such signal distribution structures.

The example method 3000 may, at block 3050, comprise forming interconnection structures. Block 3050 may, for example, share any or all characteristics with block 1050 of the example method 1000 shown in FIGS. 1 and 2, and discussed herein.

Block 3050 may, for example, comprise electrically and/or mechanically coupling the interconnection structures to the signal distribution structures (e.g., conductive vias, etc.) formed at block 3045 (or other signal distribution structures that may have been formed as part of the substrate prior to or after the substrate thinning at block 3040) and thus to the first conductive pads of the first one or more semiconductor dies and/or to the second conductive pads of the second one or more semiconductor dies. Block 3050 may, for example, comprise forming (or coupling) the interconnection structures directly on the signal distribution structures (e.g., directly on the conductive vias, etc.).

The interconnection structures may, for example, provide for the transfer of electrical signals between the first one or more semiconductor dies (or electronic components) and the second one or more semiconductor dies (or electronic components) (e.g., through the signal distribution structures formed at block 3045) and an external device.

An example implementation 400C (or assembly, subassembly, package, etc.) of block 3050 is shown at FIG. 4C. The example implementation 400C shows example conductive interconnection structures 150.

In general, block 3050 may comprise forming interconnection structures. Accordingly, the scope of various aspects of this disclosure should not be limited by characteristics of any particular interconnection structure or by any particular manner of forming or coupling an interconnection structure.

The example method 3000 may, at block 3060, comprise singulating (or excising) the electronic device from a wafer or panel of such devices. Block 3060 may, for example, share any or all characteristics with block 1060 of the example method 1000 shown in FIGS. 1 and 2, and discussed herein. The example implementation 400C shows example electronic device 200 singulated from a panel (or wafer) of such devices. For example, the lateral sides of the example electronic device 100 are generally planar. For example, the lateral sides of the carrier 140, the third adhesive 139, encapsulating material 130, and/or thinned substrate 260 may be co-planar. Also for example, in an implementation in which the first adhesive layer 119 and second adhesive layer 129 are portions of a same layer that covered the substrate 260', the lateral sides of such an adhesive layer may also be co-planar with the lateral sides of the carrier 140, the third adhesive 139, encapsulating material 130, and/or thinned substrate 260.

The example method 3000 may, for example at block 3095, comprise performing continued processing. Block 3095 may, for example, share any or all characteristics with block 1095 of the example method 1000 shown in FIGS. 1 and 2, and discussed herein.

Such continued processing may comprise performing any of a variety of continued processing operations. For example, block 3095 may comprise performing further encapsulating operations, forming signal distribution structures, coupling the electronic device to other electronic devices, packaging, shipping, marking, etc.

An example implementation 400C (or assembly, subassembly, package, etc.) of block 3095 is shown at FIG. 4C. The example implementation 400C shows the example electronic device 200 attached to a substrate 20 (e.g., a circuit board, a mother board, a packaging substrate of a multi-device module, another electronic device, etc.). For example the interconnection structures 150 and conductive vias 261 may provide a mechanical and/or electrical connection between respective conductive pads 111 and 123 of the semiconductor dies and circuit patterns 21 of the substrate 20. Such attaching may, for example, be performed utilizing a reflow process, conductive adhesive, etc. Note that, although not shown in the example implementation 400C, an underfill material (e.g., a capillary underfill, pre-applied underfill, molded underfill, etc.) may be formed between the electronic device 200 and the substrate 20.

Block 3095 may also, for example, comprise directing execution flow of the example method 3000 to any other block (or sub-block) of the example method 3000 or any other method discussed herein.

In general, block 3095 may comprise performing continued processing. Accordingly, the scope of various aspects of this disclosure should not be limited by characteristics of any particular manner of performing continued processing.

The discussion herein included numerous illustrative figures that showed various portions of a semiconductor package assembly and method of manufacturing thereof. For illustrative clarity, such figures did not show all aspects of each example assembly. Any of the example assemblies and/or methods provided herein may share any or all characteristics with any or all other assemblies and/or methods provided herein. For example and without limitation, any of the example assemblies and/or methods shown and discussed with regard to FIGS. 1 and 2, or portions thereof, may be incorporated into any of the example assemblies and/or methods discussed with regard to FIGS. 3 and 4. Conversely, any of the assemblies and/or methods shown and discussed with regard to FIGS. 3 and 4 may incorporated into the assemblies and/or methods shown and discussed with regard to FIGS. 1 and 2.

In summary, various aspects of this disclosure provide an electronic and a method of making an electronic device. As non-limiting examples, various aspects of this disclosure provide various electronic devices, and methods of making thereof, that comprise a permanently coupled carrier that enhances reliability of the electronic devices. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. An electronic device comprising:
   a substrate having a top substrate side and a bottom substrate side;
   a first semiconductor die coupled to the substrate, the first semiconductor die comprising:
      a first die top side;
      a first die bottom side coupled to the top substrate side;
      a plurality of first die lateral sides between the first die top side and the first die bottom side; and
      a first conductive pad on the first die bottom side;
   a second semiconductor die, of a different type of die than the first semiconductor die, coupled to the substrate and positioned laterally apart from the first semiconductor die, the second semiconductor die comprising:
      a second die top side;
      a second die bottom side coupled to the top substrate side;
      a plurality of second die lateral sides between the second die top side and the second die bottom side; and
      a second conductive pad on the second die bottom side; and
   an encapsulating material that covers at least the plurality of first die lateral sides and the plurality of second die lateral sides, but does not cover the first die top side and the second die top side.

2. The electronic device of claim 1, wherein the first die top side and the second die top side are at least as high as a top side of the encapsulating material.

3. The electronic device of claim 1, wherein the first die top side, the second die top side, and a top side of the encapsulating material are coplanar.

4. The electronic device of claim 1, wherein each of the first die top side, the second die top side, and a top side of the encapsulating material comprises a ground surface.

5. The electronic device of claim 1, comprising a third semiconductor die having a third die bottom side that is coupled directly to the top substrate side, and a third die top side that is lower than a top side of the encapsulating material.

6. The electronic device of claim 5, wherein the second die bottom side is directly coupled to the third die top side.

7. The electronic device of claim 6, comprising:
   a first adhesive coupling the first die bottom side to the top substrate side;
   a second adhesive coupling the second die bottom side to the third die top side; and
   a third adhesive coupling the third die bottom side to the top substrate side,
   wherein the first adhesive and the third adhesive are portions of a same continuous adhesive layer.

8. The electronic device of claim 6, comprising:
   a first adhesive coupling the first die bottom side to the top substrate side;
   a second adhesive coupling the second die bottom side to the third die top side; and
   a third adhesive coupling the third die bottom side to the top substrate side,
   wherein the first adhesive and the second adhesive are different types of adhesive.

9. The electronic device of claim 1, comprising a cover layer adhered to a top side of the encapsulating material, the first die top side, and the second die top side.

10. An electronic device comprising:
    a substrate comprising:
       a top substrate side;
       a bottom substrate side; and
       a plurality of conductive vias that extend between the top and bottom substrate sides, wherein each conductive via of the plurality of conductive vias has a top via end at the top substrate side, and a bottom via end at the bottom substrate side that is laterally wider than the top via end, and wherein each of the plurality of conductive vias comprises solder;
    a first semiconductor die coupled to the substrate, the first semiconductor die comprising:
       a first die top side;
       a first die bottom side coupled to the top substrate side;
       a plurality of first die lateral sides between the first die top side and the first die bottom side; and
       a first conductive pad on the first die bottom side;
    a second semiconductor die coupled to the substrate and positioned laterally apart from the first semiconductor die, the second semiconductor die comprising:
       a second die top side;
       a second die bottom side coupled to the top substrate side;

a plurality of second die lateral sides between the second die top side and the second die bottom side; and a second conductive pad on the second die bottom side; and an encapsulating material that covers at least the plurality of first die lateral sides and the plurality of second die lateral sides.

11. The electronic device of claim 10, wherein each of the plurality of conductive vias extends directly vertically between the top and bottom substrate sides.

12. The electronic device of claim 10, wherein each of the plurality of conductive vias comprises only solder.

13. The electronic device of claim 10, comprising a plurality of conductive interconnection structures, wherein each of the plurality of conductive interconnection structures comprises solder and is coupled to respective solder at a bottom via end of a respective one of the plurality of conductive vias.

14. The electronic device of claim 10, wherein the substrate has a thickness in a range of 10 to 50 micrometers.

15. The electronic device of claim 10, wherein:
a first conductive via of the plurality of conductive vias is formed under the first conductive pad and extends directly vertically from the bottom substrate side to the top substrate side; and
a second conductive via of the plurality of conductive vias is formed under the second conductive pad and extends directly vertically from the bottom substrate side to the top substrate side.

16. The electronic device of claim 10, comprising a plurality of conductive balls, each attached to the bottom via end of a respective one of the plurality of conductive vias.

17. A method of manufacturing an electronic device, the method comprising:
providing a substrate having a top substrate side and a bottom substrate side;
providing a first semiconductor die coupled to the substrate, the first semiconductor die comprising:
a first die top side;
a first die bottom side coupled to the top substrate side;
a plurality of first die lateral sides between the first die top side and the first die bottom side; and
a first conductive pad on the first die bottom side;

providing a second semiconductor die, of a different type of die than the first semiconductor die, coupled to the substrate and positioned laterally apart from the first semiconductor die, the second semiconductor die comprising:
a second die top side;
a second die bottom side coupled to the top substrate side;
a plurality of second die lateral sides between the second die top side and the second die bottom side; and
a second conductive pad on the second die bottom side; and providing an encapsulating material that covers at least the plurality of first die lateral sides and the plurality of second die lateral sides, but does not cover the first die top side and the second die top side.

18. The method of claim 17, wherein the first die top side, the second die top side, and a top side of the encapsulating material are coplanar.

19. The method of claim 17, comprising providing a third semiconductor die having a third die bottom side that is directly coupled to the top substrate side, and a third die top side that is directly coupled to the second die bottom side.

20. The method of claim 17, further comprising, after providing the encapsulating material:
providing a plurality of conductive vias in the substrate that extend between the top and bottom substrate sides,
wherein the substrate comprises a semiconductor substrate and/or a glass substrate.

21. The method of claim 20, further comprising, after providing the encapsulating material and prior to providing the plurality of conductive vias, thinning the substrate by grinding and/or etching.

22. The method of claim 17, wherein the substrate comprises a plurality of conductive vias that extend between the top and bottom substrate sides, wherein each conductive via of the plurality of conductive vias has a lower end at the bottom substrate side that is laterally wider than a top via end at the top substrate side.

* * * * *